(12) United States Patent
Berry, Jr. et al.

(10) Patent No.: US 6,976,199 B2
(45) Date of Patent: Dec. 13, 2005

(54) AC LSSD/LBIST TEST COVERAGE ENHANCEMENT

(75) Inventors: Robert Walter Berry, Jr., Round Rock, TX (US); Michael Timothy Saunders, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 452 days.

(21) Appl. No.: 10/042,080

(22) Filed: Jan. 7, 2002

(65) Prior Publication Data

US 2003/0131295 A1    Jul. 10, 2003

(51) Int. Cl.$^7$ ............................................. G01R 31/28
(52) U.S. Cl. ..................................................... 714/726
(58) Field of Search ......................... 714/30, 724, 726, 714/727, 729, 734, 745; 324/537; 326/16

(56) References Cited

U.S. PATENT DOCUMENTS

| | | | | |
|---|---|---|---|---|
| 5,150,366 A | * | 9/1992 | Bardell et al. | 714/728 |
| 5,278,842 A | * | 1/1994 | Berry et al. | 714/726 |
| 5,642,362 A | * | 6/1997 | Savir | 714/726 |
| 6,195,776 B1 | * | 2/2001 | Ruiz et al. | 714/738 |
| 6,490,702 B1 | * | 12/2002 | Song et al. | 714/726 |
| 6,529,033 B1 | * | 3/2003 | Park et al. | 326/16 |
| 6,678,846 B1 | * | 1/2004 | Maeno | 714/726 |

OTHER PUBLICATIONS

"Scan Latch Design for Delay Test", Jacob Savir, 1997 Test Conference (IEEE Proceedings International), Nov. 1-6, 1997, pp 446-453.*

Woytowich et al., "Delay Test of Chip I/Os Using LSSD Boundary Scan", Oct. 18-23, 1998, IEEE Test Conference Proceedings, pp 83-90.*

* cited by examiner

Primary Examiner—Albert Decady
Assistant Examiner—John P. Trimmings
(74) Attorney, Agent, or Firm—Carr LLP; Diana R. Gerhardt

(57) ABSTRACT

In an LSSD/LBIST scan design, AC scan test coverage is enhanced with a scan chain configuration capable of selectively inverting scan-in signals. For example, one or more XOR gates are inserted in the scan chain. The XOR gates is controlled by a control signal preferably coming from a primary input such that original scan-in signals as well as inverted scan-in signals are shifted into the scan chain. The proposed configuration significantly enhances the AC test coverage for a scan chain having adjacent SRLs feeding the same cone of logic by adding a simple logic circuit such as an XOR gate between the adjacent SRLs.

10 Claims, 4 Drawing Sheets

AC LSSD/LBIST TEST COVERAGE ENHANCEMENT

BACKGROUND OF THE INVENTION

1. Field of the Invention

The invention relates generally to the testing of logic circuits and, more particularly, to enhancing test coverage in an alternating-current (AC) scan design in a level-sensitive scan design (LSSD) and/or a logic built-in self test (LBIST).

2. Description of the Related Art

As integrated circuits (ICs) have become more densely packed with electronic components and more complex, the need for testing such circuits has grown significantly. Production testing of ICs was performed originally by manually creating test patterns that exercised the functional behavior of the ICs. IC designs were a combination of combinatorial random logic and simple sequential logic elements such as D-type flip flops and/or latches. The effectiveness of test patterns could be calculated by simulating them against a set of fault models.

One fault model is a "stuck-at" fault model. A stuck-at fault model assumes that a defect can be represented as a stuck terminal on a gate. Although the stuck-at fault model is only a failure model, there is some degree of correlation between defect coverage and stuck-at fault model coverage. A "stuck" terminal stays at its stuck value regardless of the values propagating to it. Therefore, to fully represent all possible stuck-at faults, we assume there is a possible stuck-at-0 and stuck-at-1 on each gate terminal. As design sizes grew, however, it became impossible to manually create functional patterns that would detect possible faults on all device pins. Even if it was practical to manually generate functional tests with adequate coverage, sequential logic within designs caused these functional pattern sizes to grow exponentially. Consequently, scan technology and structured approaches to design-for-test (DFT) were adopted.

Direct-current (DC) scan design provides access to internal sequential elements for test pattern control and observation. It reduces the sequential problem to a simpler combinational problem that lends itself to computational solutions. As a result, automated test pattern generation (ATPG) software tools can create very high coverage scan patterns even for the largest designs. DC scan is a form of scan where shifting and sampling occurs well below the device's normal operating frequency. This type of scan is effective for a pure structural approach (i.e. for stuck-at faults), but in general, timing performance cannot necessarily be verified with this type of scan.

Another type of scan is a form of scan test application called AC scan, where only the sample interval is required at the specified operating frequency in order to verify timing performance, as well as structural content. The scan data may be shifted at a different (typically slower) frequency. AC scan allows slower testers to be utilized and does not place unnecessary constraints on the design to be able to shift at-speed.

In order to provide a mechanism for testing complex circuitry, a number of built-in self test (BIST) methodologies have been employed including level-sensitive scan design (LSSD) techniques, which use master/slave latches having different clock phases to isolate each scan node. In the LSSD methodology, a long string of shift register latches (SRLs) is employed in a dual-function role that does not detract from normal circuit operation. In particular, the SRL string provides both normal input during circuit operation and also a mechanism for providing test input signals to the circuit for diagnostic purposes. These tests may be employed immediately subsequent to chip manufacture or may in fact be employed in the field to diagnose fault conditions. Depending on the source of input signals to the SRL string, either normal operations or test operations may be carried out.

In AC scan using LSSD techniques, test coverage may not be exhaustive when adjacent SRLs feed the same "cone of logic" within a combinatorial logic under test. Cone of logic is a well-known term in the field of the invention, and refers to a combinatorial logic having one output and one or more inputs influencing the output. Typically, a combinatorial logic may include a plurality of cones of logic. For example, if a combinatorial logic has three inputs and two outputs, the combinatorial logic has two cones of logic. When adjacent SRLs feed the same cone of logic, randomization of the input test patterns is lost, because the inputs to the same cone of logic may be dependent upon one another. Therefore, subsequent test patterns become highly correlated and the robustness of the tests decline.

U.S. Pat. No. 5,278,842 issued on Jan. 11, 1994, to Berry, Jr. et al. ("Berry") is directed to this problem of adjacent SRLs feeding the same cone of logic in a logic circuit. Berry addresses this problem by wiring the scan path such that no two adjacent SRLs feed the same cone of logic either by inserting an SRL that does not feed a common cone of logic or by inserting a dummy SRL between any two SRLs and using every other SRL in the chain to feed the logic. That is to say, Berry proposes a special wiring technique for selectively associating the output signal lines of the logic circuit with the input signal lines of the logic circuit. In some cases, however, the special wiring technique presented in Berry may still require some dummy SRLs to be added to the SRL string. Adding dummy SRLs take up space in the logic circuit and complicate design consideration thereof.

Therefore, there is a need for a method and apparatus for enhancing test coverage.

SUMMARY OF THE INVENTION

The present invention relates to an apparatus and method for enhancing test coverage in a level-sensitive scan design (LSSD).

In accordance of one embodiment of the invention, a logic circuit is provided. The logic circuit includes a combinatorial logic. The combinatorial logic has at least first and second input signal lines and as least a first output signal line. First, second, and third shift register latches (SRLs) are connected to the combinatorial logic. The first SRL is connected to the first input signal line for outputting a first scan signal thereto. The second SRL is connected to the second input signal line for outputting a second scan signal thereto. The third SRL is connected to the first output signal line for receiving a first output signal of the combinatorial logic. A logic unit has at least first and second logic input lines and a logic output line. The first logic input line is connected to the first SRL for receiving the first scan signal therefrom. The second logic input line is connected to a pattern adjust line for receiving a control signal. The logic output line is connected to the second SRL for outputting a logic output signal thereto. The logic output signal is at least one of the first scan signal and an inverted signal of the first scan signal, depending on the logic value of the control signal.

In accordance with another embodiment of the invention, a method for enhancing test coverage in an LSSD is provided. A first scan data bit is received and temporarily stored.

A second scan data bit is received and temporarily stored. An inverted bit of the first scan data bit is generated. A first output data bit is generated by receiving the first and second scan data bits. A second output data is generated by receiving the inverted bit and the second scan data bit. Test coverage of the combinatorial logic is enhanced by obtaining both the first and second output data bits.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The principles of the present invention and their advantages are best understood by referring to the illustrated operations of embodiment depicted in FIGS. 1–4.

Figure 1:
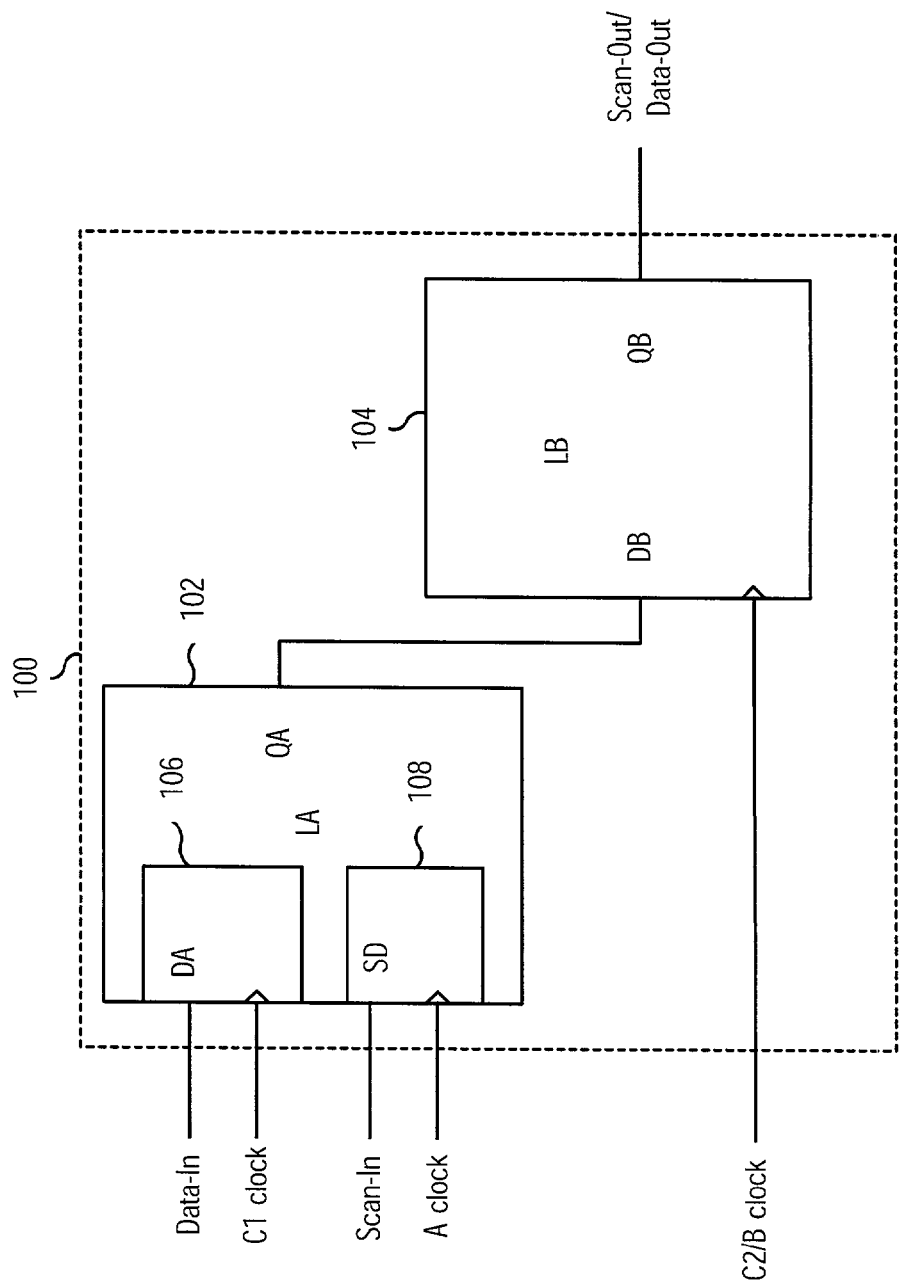
FIG. 1 depicts a block diagram of a shift register latch (SRL) as implemented in accordance with one embodiment of the present invention.

Now referring to FIG. 1, the reference numeral 100 designates a shift register latch (SRL). The SRL 100 is normally adopted in a level-sensitive scan design (LSSD) and is well known in the field of the invention. Although a detailed configuration of the SRL 100 is shown herein, the invention is not limited to using this specific type of SRL.

The SRL 100 includes two latches LA 102 and LB 104. Typically, the latches LA 102 and LB 104 are called master and slave latches, respectively, since data output QA of the latch LA 102 is input to data input DB of the latch LB 104. Latch LA 102 includes two input ports 106 and 108. Port 106 includes a DA input to receive a data-in signal and a clock input to receive a C1 clock signal. Port 108 includes a scan data input (SD) to receive a scan-in signal, and a scan clock input to receive an A clock signal. Preferably, the data-in signal contains information on logic data obtained from a combinatorial logic under test, whereas the scan-in signal contains information on test patterns. Latch LB 104 includes a DB input to receive the QA output of the latch LA 102 and a QB output to output a data-out/scan-out signal. The data-out/scan-out signal indicates either a data-out signal or a scan-out signal, depending on whether the latch LB 104 is clocked to the C2 clock or the B clock. More detailed relationship between these clocks and data/scan inputs and outputs is illustrated in relation to FIG. 4.

Thus, the SRL 100 has five inputs for receiving the data-in signal, the scan-in signal, the C1 clock signal, the A clock signal, and the C2/B clock signal. The data-in signal is received from a combinatorial logic under test (not shown). The scan-in signal is received from the output of the preceding latch in the scan string or from a primary scan input pin. The C1 and C2 clock signals are derived from a system clock, since both the C1 and C2 clocks are required during normal operation of a combinatorial logic under test. Preferably, the system clock is generated in a phase-locked loop (PLL) in a chip in which a combinatorial logic under test is located. A and B clock signals are scan-clock signals and are generated in a tester (not shown) used for scan operations. The C2/B clock represents a combination of the C2 and B clocks. This is because the latch LB 104 needs to be clocked regardless of whether the SRL 100 is in a scan mode or a normal mode of operation. Typically, the C2/B clock is obtained from an OR logic operation of the C2 and B clocks.

Figure 2:
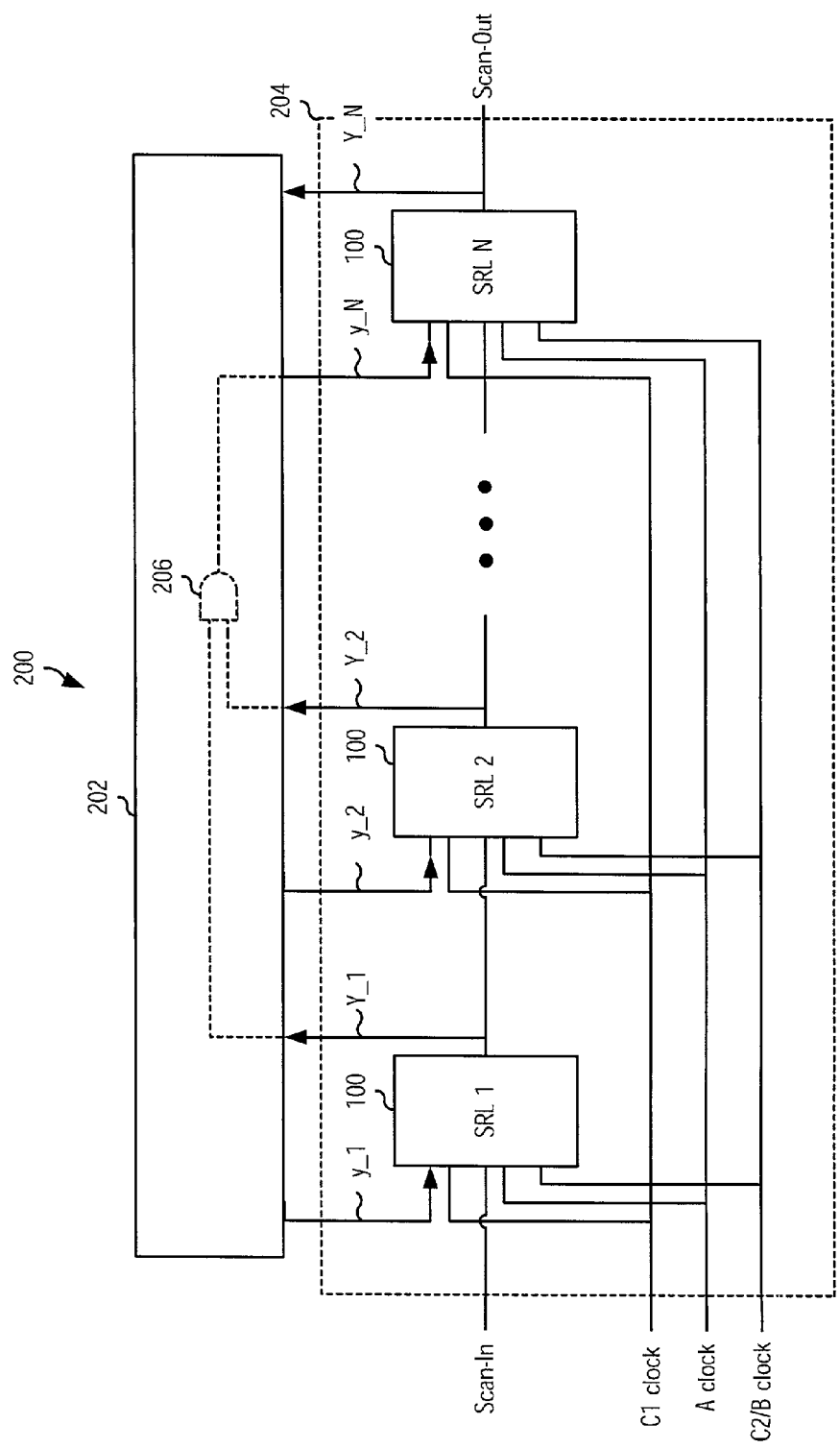
FIG. 2 depicts a block diagram illustrating a prior art SRL string connected to a combinatorial logic circuit under test.

In FIG. 2, the circuit 200 depicts a conventional test configuration. A combinatorial logic 202 under test is shown connected to a scan chain 204 through N number of data lines y_i and Y_i, wherein i=1, 2, ... N. The scan chain 204 comprises N number of SRLs, such as SRL 100 of FIG. 1, wherein N=2, 3 ... As shown in FIG. 1, each SRL 100 has a data input for receiving a data signal from the combinatorial logic 202 through the y_i line, a clock input for receiving C1 clock, a data input for receiving scan-in signal, a clock input for receiving A clock, and a clock input for receiving C2/B clock. For the sake of simplicity, FIGS. 2 and 3 do not show a detailed structure of the SRLs 100, for which FIG. 1 should be referred to.

The SRLs 100 are connected to the combinatorial logic 202 for receiving data-in signals therefrom through the lines y_i and outputting data-out signals thereto through the lines Y_1, Y_2, ... Y_N. The SRLs 100 are also connected in series to shift scan-in data bits from one SRL 100 to an adjacent SRL 100.

The combinatorial logic 202 is shown to contain an AND gate 206 connected to two SRLs 100 for receiving data signals therefrom through the lines Y_1 and Y_2, respectively, and connected to another SRL 100 for outputting a data signal thereto through the line y N, wherein N can be any integer larger than 2 depending on the specific configuration of the combinatorial logic 202 and the scan chain 204. It should be noted that the AND gate 206 is merely illustrative of logic that may be utilized within the combinatorial logic 202. The combinatorial logic 202, however, may comprise any logic with any number of inputs and outputs. However, the AND gate 206 is shown to illustrate the present invention with a simple example.

In this example, the AND gate 206 forms a "cone of logic." The two data signals input (through the lines Y_1 and Y_2) to the AND gate 206 determine the output signal of the AND gate 206. Generally, a fault in an AC level-sensitive scan design (LSSD) technique is detected when a particular node of the AND gate 206 malfunctions in such a way that the node fails to meet a timing specification of the AND gate 206. Typically, a node fails to meet a timing specification when a signal present at the node is too slow to transition from one logical state to the other. Since there are two logical states (a logical 0 and a logical 1), there are two possible faults for each node. Therefore, assuming that the AND gate 206 is under test for possible faults using an AC LSSD technique, there are six possible faults. This results from the fact that there are two possible faults for each node of the AND gate 206, and that the AND gate has three nodes (two input nodes and one output node) in total.

During test phases, a test pattern is shifted into the scan chain 204 on the scan-in line. The pattern is used to drive the combinatorial logic 202 for test purposes. In AC tests, it is desirable to apply a timed transition from a logical 1 to a logical 0 or the inverse. This requires the input signal to transition to its complement on the C2/B clock and the results to be captured on the C1 clock with the delay between the C2/B clock and the C1 clock being equal to the cycle time of the test. Since it is not practical to wait until a whole new pattern is shifted into the N positions of the scan chain 204, ending the scan-in signal on the A clock will allow differing data to be on the LA & LB portions of the SRLs 100 which will allow the launch of a transition on a C2 clock. Nonetheless, it is desirable that the patterns applied to the combinatorial logic 202 are as statistically uncorrelated as possible.

Typically, however, a particular group of inputs to the combinatorial logic 202 are fed into the same cone of logic. In the example above, the Y_1 and Y_2 are fed into the AND gate 206. In such cases, randomization of the input test patterns is lost, because of the dependency of the inputs to the same cone of logic. Therefore, subsequent test patterns become highly correlated and the robustness of the tests decline.

Figure 3:
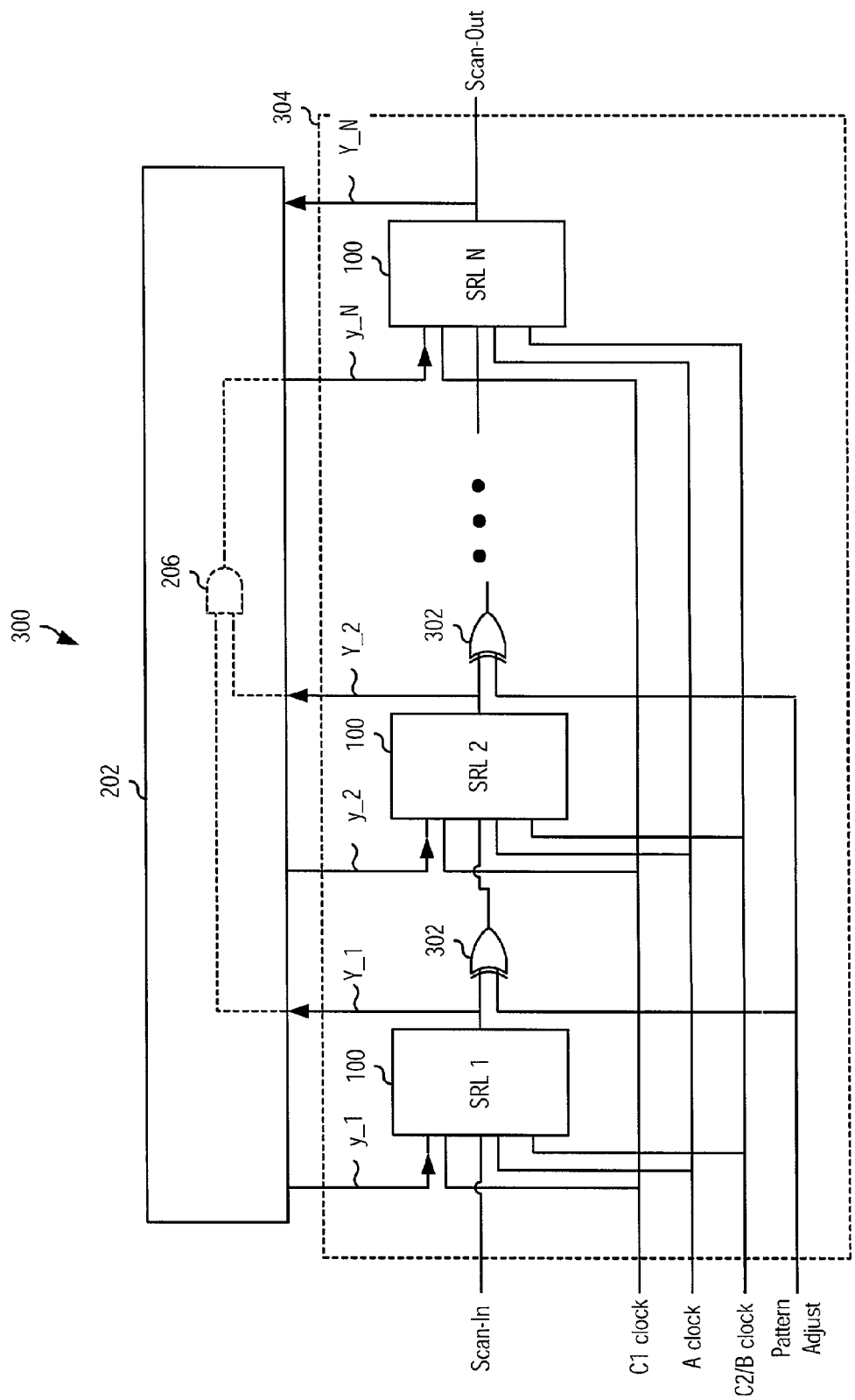
FIG. 3 depicts a block diagram illustrating features of one embodiment of the invention based on the prior art SRL string as shown in FIG. 2.

FIG. 3 illustrates one embodiment of the present invention to enhance test coverage. The circuit 300 represents an improvement to the circuit 200 in accordance with the present invention. Test coverage is enhanced by XOR gates 302 inserted in the scan path of a scan chain 304. One input of an XOR gate 302 is connected to the data output of an SRL 100. The other input of the XOR gate 302 is connected to a pattern-adjust line for receiving control signals. The control signal is a scan control signal that should not toggle during test pattern scanning. Typically, the control signal comes from an input pin to the device under test. When the control signal is a logical 0, the circuit 300 operates in substantially the same manner as the circuit 200 of FIG. 2. This results from the fact that the output of an XOR gate 302 is the same as one input thereof when the other input is a logical 0. Thus, for this mode of operation, the circuit 300 can have the same test coverage as the circuit 200. Now when the control signal is a logical 1, the data output of an SRL 100 is inverted before it is transmitted to the next SRL 100 in the scan chain 204.

As in FIG. 2, the AND gate 206 is shown in the circuit 300 for illustrative purpose only as a cone of logic that may be within the combinatorial logic 202. In this example, wherein the leftmost two adjacent SRLs 100 feed the same cone of logic (i.e., the AND gate 206), the leftmost XOR gate 302 is connected between the two adjacent SRLs 100. This XOR gate 302 enhances the test coverage of the AND gate 206 by providing both normal and inverted scan data inputs, depending on the pattern-adjust input. It should be noted that the XOR gates 302 as shown in the circuit 300 are for illustrative purposes only and may be replaced with a different logic capable of selectively inverting the scan-in signal in a similar fashion as described above, without departing from the true spirit of the invention.

Figure 4:
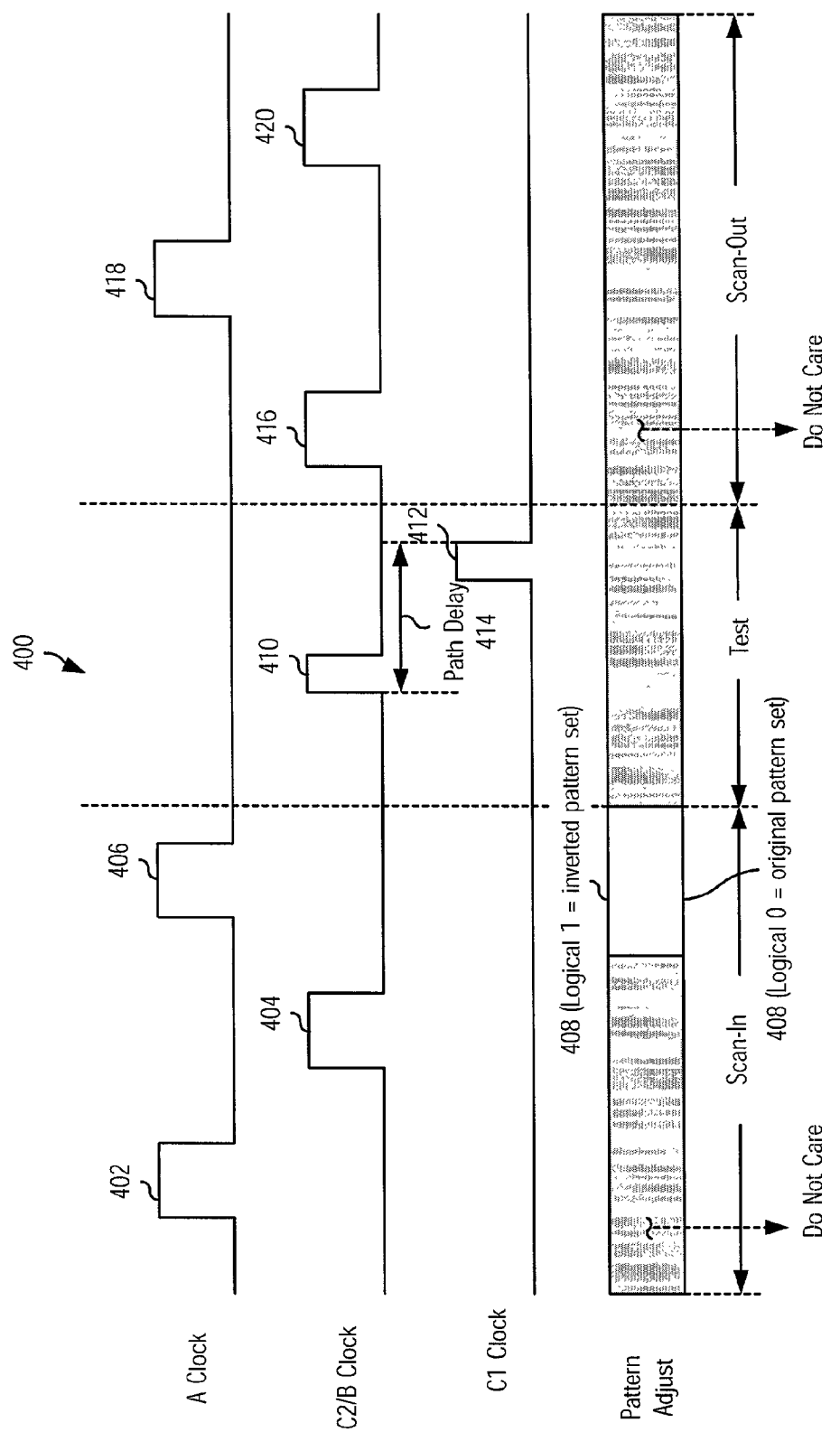
FIG. 4 depicts a timing diagram illustrating a timing relationship between the signals shown in FIG. 3.

Now referring to FIG. 4, a timing diagram 400 depicts a timing relationship between various clocks and the pattern adjust control signal as shown in FIG. 3. As mentioned above with reference to FIG. 1, the C1 and C2 clocks are derived from a system clock, whereas A and B clocks are generated by a tester. The timing diagram 400 contains three phases: scan-in, test, and scan-out.

First, an A clock pulse 402 is applied to the port 108 of an SRL 100. As mentioned above, the port 108 is a scan-in portion of the latch LA 102. Preferably, at the rising edge of the A clock pulse 402, a scan-in signal (a test pattern) is captured by the latch LA 102 of each SRL 100 in the scan chain 304 and made available at the data output QA of the latch LA 102 of each SRL 100. After the A clock pulse 402 is applied, a B clock pulse 404 is applied to the latch LB 104 of each SRL 100. Preferably, at the rising edge of the B clock pulse 404, the scan-in signal is sampled at the latch LB 104 of each SRL 100 and made available at the data output QB of the latch LB 104 of each SRL 100 in the scan chain 304.

Now that the output of each SRL 100 is determined and used to drive one input of each XOR gate 302, the output of each XOR gate 302 is determined by a pattern-adjust signal 408 during the period as shown in FIG. 4. For other shaded portions, it does not matter whether the pattern-adjust signal 408 is a logical 0 or 1. The pattern-adjust signal 408 could be either a logical 0 or 1. As mentioned above, the output of each XOR gate 302 is virtually identical to the data output QB of the latch LB 104 of each SRL 100, when the pattern-adjust signal is a logical 0. In this case, the circuit 300 is virtually identical to the circuit 200. If the pattern adjust signal is a logical 1, the output of each XOR gate 302 is an inverted logical state of the data output QB of the latch LB 104 of each SRL 100 in the scan chain 304.

Another A clock pulse 406 is now applied after the B clock pulse 404 is complete. Preferably, the pattern adjust signal 408 is maintained in one logical state (either a logical 0 or a logical 1) for the duration of the A clock pulse 406. Typically the pattern adjust signal 408 will be held either high or low for the full duration of each scan. It is only critical to have it at a fixed state for the duration of the active portion of the A clock pulse 406. If the A clock is level triggered, it must be active for the full pulse width plus any setup and hold requirements. If the A clock is edge triggered, it must simply meet the setup and hold requirements for that edge. Since the A clock pulse 406 follows the B clock pulse 404, the A clock pulse 406 triggers each SRL 100 in the scan chain 304 to capture an output (a scan signal) from a preceding XOR gate 302 in the scan chain 304. As shown in FIG. 4 and explained above, the pattern-adjust signal 408 is determined to be either a logical 0 or 1 for the duration of the A clock pulse 406. Thus, at the rising edge of the A clock pulse 406, an original pattern set or an inverted pattern set is shifted to one SRL 100 to a following SRL 100, depending on the logical state of the pattern adjust signal 408.

The scan-in phase as shown in FIG. 4 is a simple example of testing a combinatorial logic having two inputs fed by the two leftmost SRLs 100. For example, the AND gate 206 has two inputs fed by the two leftmost SRLs 100. For testing a logic having inputs fed by an SRL 100 other than the two leftmost SRLs 100, it is necessary to have more clock pulses than the aforementioned clock pulses 402, 404, and 406. For simplicity, however, only these three clock pulses are shown in the timing diagram 400. It is apparent to a person with ordinary skill in the art, however, that the scan-in phase of the timing diagram 400 can have more A and B clock pulses without departing from the true spirit of the present invention. Generally, there could be any number of alternating A and B clock pulses in the scan-in phase. The same applies to the scan-out phase of the timing diagram 400.

Now that a test pattern set is captured by the two leftmost SRLs 100 feeding the AND gate 206 under test, a test phase begins. Preferably, the test pattern set consists of a starting data bit before C2 clock pulse 410 and an ending data bit after the C2 clock pulse 410 into the logic under test. Thus, there are two bits of data for each input to the combinatorial logic 202. During the test phase, the C1 and C2 clocks are input to the SRLs 100 for the purpose of stimulating the combinatorial logic 202 under test. Preferably, the C2 clock pulse 410 and C1 clock pulse 412 are narrower in width than the scan clock pulses such as the A clock pulse 402 and the B clock pulse 404, because system clocks are operating at a higher frequency than a scan clock frequency in LSSD scan technique. During the test phase, the combinatorial logic 202 is tested to determine whether the combinatorial logic 202 has any faults. Since the present invention is directed to an AC testing, it will be determined whether each node of the combinatorial logic 202 meets transition timing requirements set forth in its design specification.

The path delay 414 between the C2 clock pulse 410 and the C1 clock pulse 412 is closely related to such transition timing requirements. In the aforementioned example of the AND gate 206, the leftmost two adjacent SRLs 100 output a test pattern set captured therein to the inputs of the AND gate 206, during the C2 clock pulse 410. Then, the C1 clock pulse 412 is applied to all the SRLs 100, including the rightmost SRL 100, which receives the output of the AND gate 206. Therefore, any AC faults in any of the input and output nodes of the AND gate 206 would possibly lead to an incorrect output value of the AND gate 206 captured in the rightmost SRL 100. Even if an incorrect output value is captured, it may not be clear—from a pair of test patterns making a transition—which node(s) are faulty, i.e., too slow to make the transition within the duration of the path delay 414. Therefore, it is very important to enhance test coverage beyond what is achievable with the adjacent bit dependency arising from the adjacent SRLs feeding inputs to the same cone of logic.

The pattern-adjust signal enables this enhancement of test coverage by feeding an inverted test pattern set as well as an original test pattern set by controlling the XOR gates 302. Whenever necessary, the entire operation shown in the timing diagram 400 is repeated for the same test patterns and different pattern-adjust signals. It should be noted herein that it is not always necessary to do so.

After the test phase, a scan-out phase begins to read the resulting data bits obtained from the combinatorial logic 202 under test. A B clock pulse 416 is applied to the SRLs 100 in the scan chain 304 to shift those data bits to the right to make the bits available at the output of the SRLs 100. At least some of these bits represent the response of the combinatorial logic 202 to a test pattern previously input to the scan chain 304 and captured in the latches LA 102 during the scan-in phase of the timing diagram 400. After the B clock pulse 416, an A clock pulse 418 is applied to shift these bits further to the right in the same fashion as mentioned above in relation to the scan-in phase. Another B clock pulse 420 follows to shift these bits further to the right in the scan chain 304. Alternating A and B clock pulses will continue until all data bits containing information on the response of the combinatorial logic 202 are taken out of the scan chain 304. Therefore, as mentioned above, there may be more alternating A and B clock pulses after the B clock pulse 420, depending on the structure of the combinatorial logic 202 under test.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A logic circuit comprising:
   a combinatorial logic having at least first and second input signal lines and at least a first output signal line; and
   a shift register latch (SRL) chain and a last SRL within the SRL chain, connected to the output of the combinatorial logic, a first SRL of the SRL chain being connected to the first input signal line for outputting a first scan signal thereto, a second SRL of the SRL chain being connected to the second input signal line for outputting a second scan signal thereto, the last SRL being connected to the first output signal line for receiving a first output signal of the combinatorial logic; and
   a logic unit having at least first and second logic input lines and a logic output line, the first logic input line being connected to the first SRL for receiving the first scan signal therefrom, the second logic input line being connected to a pattern adjust line for receiving a control signal, the logic output line being connected to the second SRL for outputting a logic output signal thereto, wherein the logic output signal is at least one of the first scan signal and an inverted signal of the first scan signal, depending on the logic value of the control signal.

2. The logic circuit of claim 1, wherein the logic unit comprises an XOR gate having the first and second logic input lines and the logic output line.

3. The logic circuit of claim 1, wherein the logic output signal is the first scan signal when the control signal is a logical 0, and is the inverted signal when the control signal is a logical 1.

4. The logic circuit of claim 1, wherein each of the SRLs comprises a master latch and a slave latch, the slave latch being connected to the master latch for receiving a master output signal therefrom, the master latch having a data input signal line, a scan input signal line, a data clock line, and a scan clock line, the slave latch having a slave clock line.

5. The logic circuit of claim 1, wherein each SRL of SRL latch chain and the last SRL within the SRL chain, comprises a master latch and a slave latch, the slave latch being connected to the master latch for receiving a master output signal therefrom, the master latch having a data input signal line, a scan input signal line, a data clock line, and a scan clock line, the slave latch having a slave clock line, wherein the master latch is synchronized to a data clock signal on the data clock line for receiving and temporarily storing a logic data bit through the data input signal line, wherein the master latch is synchronized to a scan clock signal on the scan clock line for receiving and temporarily storing a scan data bit through the scan input signal line, and wherein the slave latch is synchronized to a slave clock signal on the slave clock line for receiving and temporarily storing at least one of the logic data bit and the scan data bit from the master latch.

6. A method for enhancing test coverage in a level-sensitive scan design (LSSD), the method comprising the steps of:
   receiving a first scan data bit by a first SRL;
   temporarily storing the first scan data bit in the first SRL;
   transmitting the first scan data bit from the first SRL to a logic unit;
   transmitting the first scan data bit from the logic unit to a second SRL if there is a logic 0 control signal;
   temporarily storing the first scan data bit in the second SRL;
   transmitting an inverted bit of the first scan data bit from the logic unit to the second SRL if there is a logic 1 control signal;
   temporarily storing the inverted bit in the second SRL;
   receiving a second scan data bit by the first SRL;
   temporarily storing the second scan data bit in the first SRL;
   transmitting the first scan data bit from the second SRL to a combinatorial logic, and the second scan data bit from the first SRL to the combinatorial logic;
   transmitting the inverted bit from the second SRL to the combinatorial logic, and the second scan data bit from the first SRL to the combinatorial logic;

receiving a first output data bit of the combinatorial logic by a last SRL within the SRL chain, the first output data bit being output from the combinatorial logic receiving at least the first and second scan data bits in response to a logic 0 control signal;

temporarily storing the first output data bit in the last SRL;

receiving a second output data bit of the combinatorial logic by the last SRL within the SRL chain, the second output data bit being output from the combinatorial logic receiving at least the inverted bit from the second SRL and the second scan data bit in response to a logic 1 control signal;

temporarily storing the second output data bit in the last SRL; and enhancing test coverage of the combinatorial logic by obtaining both the first and second output data bits from the last SRL.

7. The method of claim 6, wherein the step of transmitting the inverted bit of the first scan data bit from the logic unit to the second SRL further comprises the step of XORing the first scan data bit with the logic 1 control signal.

8. The method of claim 6, wherein each of the first, second, and last SRLs comprises a master latch and a slave latch, the slave latch being connected to the master latch for receiving a master output signal therefrom, the master latch having a data input signal line, a scan input signal line, a data clock line, and a scan clock line, the slave latch having a slave clock line.

9. The method of claim 6, wherein each of the first, second, and last SRLs comprises a master latch and a slave latch, the slave latch being connected to the master latch for receiving a master output signal therefrom, the master latch having a data input signal line, a scan input signal line, a data clock line, and a scan clock line, the slave latch having a slave clock line, wherein the master latch is synchronized to a data clock signal on the data clock line for receiving and temporarily storing a logic data bit through the data input signal line, wherein the master latch is synchronized to a scan clock signal on the scan clock line for receiving and temporarily storing a scan data bit through the scan input signal line, and wherein the slave latch is synchronized to a slave clock signal on the slave clock line for receiving and temporarily storing at least one of the logic data bit and the scan data bit from the master latch.

10. A method for enhancing test coverage in a level-sensitive scan design (LSSD), the method comprising the steps of:

receiving and temporarily storing a first scan data bit;

transmitting the first scan data bit from a first SRL through a logic unit to a second SRL if there is a logic 0 control signal;

receiving and temporarily storing a second scan data bit;

generating an inverted bit of the first scan data bit if there is a logic 1 control signal;

generating a first output data bit by receiving the first and second scan data bits;

transmitting the first output data bit to a last SRL within the SRL chain;

generating a second output data bit by receiving the inverted bit and the second scan data bit;

transmitting the second output data bit to the last SRL within the SRL chain; and enhancing test coverage of combinational logic by obtaining a result from both the first and second output data bits.

* * * * *